United States Patent
Beaujuge et al.

(10) Patent No.: US 8,372,315 B2
(45) Date of Patent: Feb. 12, 2013

(54) GREEN SOLUBLE CONJUGATED POLYMERS WITH HIGH CHARGE CARRIER MOBILITIES

(75) Inventors: Pierre Marc Beaujuge, Jeddah (SA); John R. Reynolds, Gainesville, FL (US); Stefan Martin Ellinger, Visp (CH)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 13/321,880

(22) PCT Filed: May 26, 2010

(86) PCT No.: PCT/US2010/036172
§ 371 (c)(1),
(2), (4) Date: Nov. 22, 2011

(87) PCT Pub. No.: WO2010/138566
PCT Pub. Date: Dec. 2, 2010

(65) Prior Publication Data
US 2012/0061630 A1    Mar. 15, 2012

Related U.S. Application Data

(60) Provisional application No. 61/181,058, filed on May 26, 2009.

(51) Int. Cl.
*G02B 5/23* (2006.01)
*C08F 28/06* (2006.01)

(52) U.S. Cl. ............ 252/586; 525/186; 525/326.7; 525/327.1; 526/257; 528/321; 528/377; 528/380; 546/114; 977/735

(58) Field of Classification Search ............ 252/586; 257/40, E51.027; 525/186, 326.7, 327.1; 528/9, 37, 321, 377, 380; 544/342, 343; 546/114; 548/126, 148, 149, 151, 418, 423; 549/41; 977/734, 735; 526/257
See application file for complete search history.

(56) References Cited

FOREIGN PATENT DOCUMENTS
WO    WO 2006/017530 A1    2/2006
(Continued)

OTHER PUBLICATIONS

P.M. Beaujuge, S. Ellinger and J. R. Reynolds, The donor—acceptor approach allows a black-to-transmissive switching polymeric electrochrome, Nature Materials, vol. 7, pp. 795-799, © 2008 Macmillan Publishers Limited.*

(Continued)

*Primary Examiner* — Bijan Ahvazi
(74) *Attorney, Agent, or Firm* — Saliwanchik, Lloyd & Eisenschenk (57) ABSTRACT

A donor-acceptor (DA) π-conjugated polymer with high charge transfer mobility has a plurality of $D1_k AD1_k$ portions, where k is 1 or 2, D1 is a donor unit having at least one solubilizing side chain, and A is an acceptor unit, and the donor-acceptor (DA) π-conjugated polymer has a plurality of $D2_m$ spacer sequences situated between the $D1_k AD1_k$ portions, where m is 1 to 6 and D2 is a second donor unit where all atoms of the unit are coplanar in at least one conformation that the unit can assume. The DA π-conjugated polymer can reflect a blue tinted green, deep green, or yellow tinted green color. The DA π-conjugated polymers have space-charge limited (SCL) zero field hole mobilities of at least $1 \times 10^{-6}$ $cm^2 V^{-1} s^{-1}$.

12 Claims, 5 Drawing Sheets

FOREIGN PATENT DOCUMENTS

| WO | WO 2007/087587 A2 | 8/2007 |
|---|---|---|
| WO | WO 2007/130025 A1 | 11/2007 |
| WO | WO 2009/058877 A1 | 5/2009 |

OTHER PUBLICATIONS

Yangjun Xia, Xianyu Deng, Li Wang, Xianzhen Li, Xuhui Zhu, Yong Cao, An extremely narrow-band-gap conjugated polymer with heterocyclic backbone and its use in optoelectronic devices, Macromol. Rapid Commun. 2006, 27, 1260-1264,_ 2006 Wiley-VCH Verlag GmbH & Co. KGaA, Weinheim.*

Brédas, J.L. et al., Charge Transfer and Energy-Transfer Processes in π-Conjugated Oligomers and Polyers: A Molecular Picture, *Chem. Rev.*, 2004, pp. 4971-5003, vol. 104, No. 11.

Moliton, A. et al., Review of electronic and optical properties of semiconducting π-conjugated polymers: applications in optoelectronics, *Polym Int.*, 2004, pp. 1397-1412, vol. 53, No. 10.

Peeters, E., et al., Photoinduced Electron Transfer in a Mesogenic Donor—Acceptor—Donor System, *Chem. Eur. J.*, 2002, pp. 4470-4474, vol. 8, No. 19.

* cited by examiner

GREEN SOLUBLE CONJUGATED POLYMERS WITH HIGH CHARGE CARRIER MOBILITIES

CROSS-REFERENCE TO RELATED APPLICATIONS

This application is the U.S. national stage application of International Patent Application No. PCT/US2010/036172, filed May 26, 2010, which claims the benefit of U.S. Provisional Application Ser. No. 61/181,058, filed May 26, 2009, the disclosures of which are hereby incorporated by reference in their entireties, including any figures, tables, or drawings.

GOVERNMENT SUPPORT

The subject invention was made with government support under a research project supported by Air Force Office of Scientific Research, Contract No. UF Project 59866. The government has certain rights to this invention.

BACKGROUND OF INVENTION

Energy band mixing induced in molecular systems involving electron rich and poor π-conjugated substituents, a "donor-acceptor" (DA) approach, has found application in the design and synthesis of: light-emitting semiconductors; n-channel and ambipolar semiconductors for organic thin-film transistors; active organic components for chemical biosensors; and non-emissive organic electrochromics. Another significant application is directed toward low-bandgap photovoltaics that absorb in the visible and/or near infra-red (NIR) regions of the electromagnetic spectrum, particularly for bulk-heterojunction solar cells with improved solar energy conversion. Donor-acceptor π-conjugated polymers are attractive for use in innovative high-performance flexible light-harvesting technologies. These DA π-conjugated polymers allow easy bandgap engineering via structural control and allow mechanical deformability that can enable flexible electronic systems. Additionally, DA π-conjugated polymers have the potential for fabrication in a manner that is scalable at a low-cost and permits a high-throughput manufacture of light-harvesting devices. The DA π-conjugated polymer solution has considerable advantages over approaches employing inorganic equivalents for applications such as large-area solar cells that can be used for vehicle or housing roofs or for portable electronic devices made with finely printed photoactive arrays.

Although the donor-acceptor theory was first reported for macromolecular systems by Having a et al., *Synth. Met.* 1993, 55, 299, it has only recently been demonstrated with synthetic conducting polymers where good performance has been achieved in the context of photovoltaic cell efficiency. Efficiencies of up to about 5% have been demonstrated in systems, but the norm for practical systems has been significantly less. In general, the low power conversion efficiencies obtained using DA π-conjugated polymers can be attributed to: 1) their absorption spectrum is often limited to a small portion of the visible spectrum (typically the red region); and 2) their intrinsic charge carrier mobilities are low when used in solid state devices.

Two-band absorbing materials reflecting the color green are those that display two absorbance maxima in the visible light region with a window of transmission in the 480-560 nm range. In spite of about two decades of intense research on photovoltaic polymers, few two-band absorbing green polymeric photovoltaics have been reported, primarily due to the complexity of engineering the molecular structure of the repeat units that form the conjugated polymeric material. Simultaneous achievement of the required optical properties and desired charge-carrier mobilities has not been reported. To date, reported charge carrier mobilities have been low for such polymeric materials, which limit charge transport in solid state devices and has not enabled viable devices for solar energy conversion.

The neutral state green π-conjugated polymers, two-band absorbing materials, described in the literature to date, have disappointing charge-carrier mobilities, which in turn have not encouraged their use in light harvesting devices. The disappointing charge-carrier mobility of these polymers is due to: 1) a lack of favorable intermolecular interactions, primarily poor π-stacking; 2) an unfavourably large chain-to-chain distances (or lamellar spacing); and 3) relatively little extended conjugation due to a low level of planarity of the polymer's main-chains. Effective bulk-heterojunction solar cells require high charge carrier mobilities so that photogenerated excitons (geminate electron-hole pairs) can undergo diffusion and dissociation processes within the active layer of the device with subsequent rapid transport of the dissociated charges to collection electrodes. Unless a solar cell material displays sufficiently high charge carrier mobility, dissociated charges recombine before collection and the device exhibits poor solar energy conversion. Hence the development of a green π-conjugated polymer with high charge carrier mobilities that is readily processable is desirable for light harvesting applications.

BRIEF SUMMARY

Embodiments of the invention are directed to donor-acceptor (DA) π-conjugated polymers with high charge carrier mobilities, having space-charge limited (SCL) zero field hole mobilities of at least $1\times10^{-6}$ cm$^2$V$^{-1}$s$^{-1}$. The DA π-conjugated polymers are a plurality of $D1_k AD1_k$ portions, where k is 1 or 2, D1's are one or more donor units having at least one solubilizing side chain and A is an acceptor unit, which are separated by $D2_m$ spacer sequences where m is 1 to 6 and D2 is a second donor unit. The D2 units are of a structure that permits all atoms of the unit to reside in a single plane so that the space sequence can assume a conformation that yields extended conjugation and allows favorable stacking between DA polymers, which provides the improved charge carrier mobilities to these DA π-conjugated polymers. The DA π-conjugated polymer can be designed to absorb light in two bands and reflect a blue tinted green, deep green, or yellow tinted green color.

The D1 units of the DA π-conjugated polymer can be 3,4-dioxythiophene, 3,4-dioxypyrrole, 3,4-dioxyfuran, 3,4-dioxyselenophene, or 3,4-dioxytelurophene, 3,4-alkylenedioxythiophene, 3,4-alkylenedioxypyrrole, 3,4-alkylenedioxyfuran, 3,4-alkylenedioxyselenophene, or 3,4-alkylenedioxytelurophene, with solubilizing side chain, and, when the value of k is 2, can be fused heteroaromatic rings. The solublizing side chain on D1 can be branched or straight chained C3 to C30 alkyl, or alkylene, or alkylaryl and can be uninterrupted, unsubstituted, interrupted or substituted with one or more functional groups, for example hydroxy, amino, ether, ester, carbonyl, carboxylic acid cyano, or halo groups.

The A unit of the DA π-conjugated polymer is a nitrogen-containing electron-accepting heterocycle. Examples of such heterocycles include benzothiadiazole, thiadiazoloquinoxaline, quinoxaline, thienothiadiazole, thienopyrazine, pyrazinoquinoxaline, benzobisthiadiazole and thiadiazolothienpyrazine that can be substituted or unsubstituted.

The D2 units of the DA π-conjugated polymer are independently aromatic and heteroaromatic units whose structures are fixed in, or can assume, a conformation that is planar, as the co-planarity of atoms in these units promotes the desired high charge carrier mobilities. Heteroaromatic units that can be used include thiophene, pyrrole, furan, selenophene and telurophene units that can be unsubstituted or substituted in the 3 and 4 position with hydroxy, phenoxy, ethenyloxy, formyloxy, cyano, amino, halo (fluoro, chloro, bromo, or iodo), carboxylic acid, bridging 1,2-vinylenedioxy, bridging 1,2-phenylenedioxy, or can be any planar polycyclic aromatic based on the heteroaromatic base.

Another embodiment of the invention is the DA π-conjugated polymer that is blended with an acceptor moiety. Appropriate acceptor moieties that can be blended with the DA π-conjugated polymers include buckminsterfullerene molecules, including PCBMs such as [6,6]-phenyl-C61-butyric acid methyl ester ($PC_{60}BM$), [6,6]-phenyl-C71-butyric acid methyl ester ($PC_{70}BM$) and other substituted C60 or C70 buckminsterfullerenes, and inorganic metal oxides.

DETAILED DISCLOSURE

Embodiments of the invention are directed to the preparation of donor-acceptor (DA) π-conjugated polymers that possess substantial charge-carrier mobility when used in a solid state device such as a solar cell or other light harvesting device. In one embodiment of the invention the DA π-conjugated polymers are two band absorbing polymers that display (reflect) a blue tinted green, deep green, or yellow tinted green color in their neutral state. The DA π-conjugated polymers provide a space-charge limited (SCL) zero field hole mobility of at least $1 \times 10^{-6}$ $cm^2V^{-1}s^{-1}$. The DA π-conjugated polymers comprise a repeating unit that has a structural portion that provides a course band-gap tuning, which imparts a green hue, and provides the ability for the polymer to be readily processed, including solution processing. The novel DA π-conjugated polymers also contain a spacer sequence that promotes a coplanar conformation of adjacent aromatic rings in the sequence that enables an extended conjugation length, π-stacking and favorable lamellar spacing, such that a substantial charge carrier mobility is possible under the ambient conditions. The units of the spacer segment have compositions that allow all of the atoms of the unit to reside in a single plane. These portions of the repeating units of the DA π-conjugated polymers are illustrated in FIG. 1.

Figure 1:
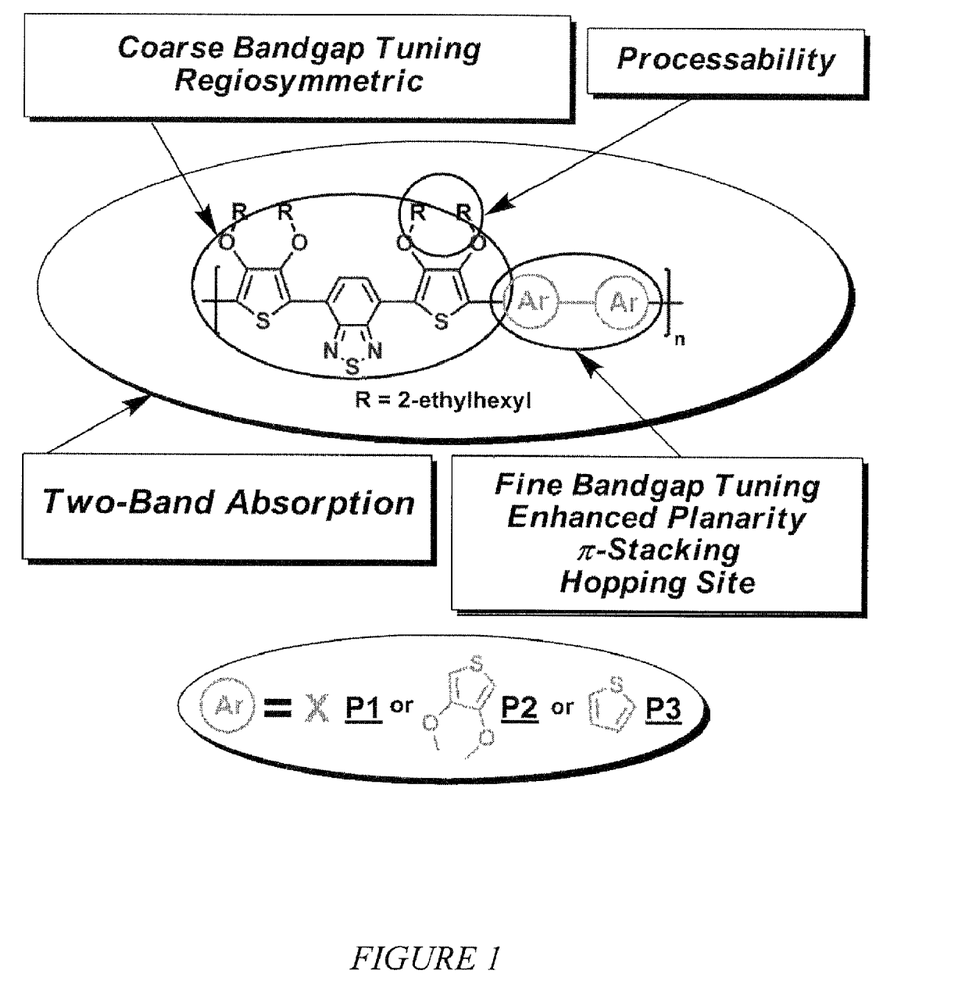
FIG. 1 is a schematic of the features of a dioxythiophene-benzothiadiazole (DOT-BTD) donor-acceptor polymer according to an embodiment of the invention that allows tunable absorption spectra and has good charge transport properties where X implies the absence of a spacer sequence in the repeating unit for P1.

As illustrated in FIG. 1, one portion of the repeating unit displays three aromatic heterocycles in a DAD sequence, where an electron poor acceptor unit is situated between two to four electron rich donor units to provide the dual band absorption of mainly red and blue light, which results in a green color and can be varied in structure such that the hue can be tuned by the structure of the units. The donor units of this portion are substituted with sufficiently large and flexible substituents that are coupled to the heterocycle to induce solubility and fusibility to the resultant polymer. The sufficiently large substituents provide good processing features to the DA π-conjugated polymers containing these units, including the ability to process films and other forms of these polymers from solution or from the melt. Although the preparation of this portion of the repeating unit is often facilitated by the donor units having an identical structure, in some embodiments of the invention the donor units of this portion of the repeating unit are different.

As illustrated in FIG. 1, individual DAD sequences are separated by a second portion, a spacer segment of two or more aromatic units, of the repeating units in the novel DA π-conjugated polymers. In some embodiments of the invention non-aromatic conjugated groups can reside between aromatic rings in the segment. This second portion of the repeating units provides a structure that permits fine bandgap tuning of the DAD sequence, but is incorporated such that planarity and π-stacking between a plurality of DA π-conjugated polymers is encouraged, which results in the DA polymer's high charge carrier mobility. The aromatic units of this portion of the repeating unit are free of substituents on the aromatic rings that obliged any atoms of the unit's structure to reside outside of the plane defined by the aromatic ring. Although shown as thiophenes in FIG. 1, the aromatic or conjugated units can be of various structure and the individual aromatic or conjugated units of the plurality of aromatic or conjugated units can be the same structure or different structures.

Figure 2:
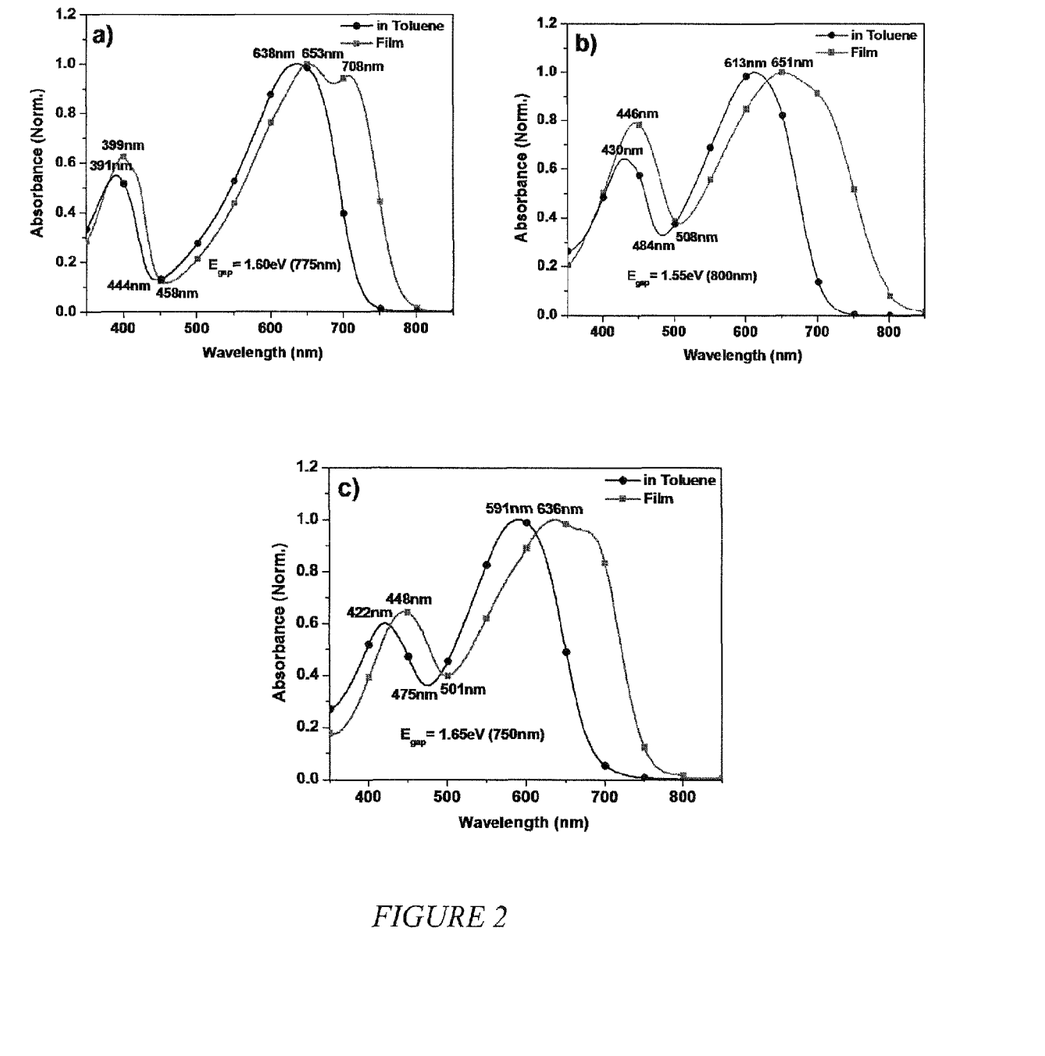
FIG. 2 displays optical absorption spectra for control polymers and a DA-copolymer according to an embodiment of the invention for polymers a) P1, b) P2 and c) P3 in a toluene solution and in a thin film where spectra are normalized at the absorption maximum.

As illustrated in FIG. 2, the DA π-conjugated polymers display absorption of light at two-bands in the visible region of the electromagnetic spectrum. These absorptions leave a window of transmission in the 490-580 nm range that allows reflection of the color green by these DA polymers. As can be seen in FIG. 2, the polymer P1 does not have a significant absorption at wavelengths in the wavelength range at about 450 to 500 nm which results in the DA polymer displaying a blue color. The inclusion of an appropriate spacer segment provides a significant absorption in the 450 to 500 nm range, which results in a green hue. A desirable spacer segment provides a pronounced degree of co-planarity of its aromatic units with the electron-rich donor units of the other portion of the repeat units. This planarity favors charge transport properties of the resulting polymers in devices.

By controlling the structure of the repeating units of the DA π-conjugated polymers the energy-gap can be fine tuned while having an adequate set of absorption bands in the visible spectrum. The variations to the DAD portion of the repeating units of the novel DA π-conjugated polymers that result in a neutral state green color and a desired hue can be carried out as disclosed in Beaujuge et al., International Application No. PCT/US2008/081599, filed Oct. 29, 2008, entitled "Green to Transmissive Soluble Electrochromic Polymers", and is incorporated herein by reference. The spacer segment of the present DA π-conjugated polymers provides a plurality of donor units that are fixed in, or can assume, a conformation where all atoms of the unit can reside in a single plane. By including the planar donor units, extended conjugation and chain-chain contact is promoted, which allows the DA π-conjugated polymers to achieve significantly superior charge carrier mobilities, with space-charge limited (SCL) zero field hole mobilities of at least $1 \times 10^{-6}$ cm$^2$V$^{-1}$s$^{-1}$. These solvent- and melt-processable DA π-conjugated polymers display a two-band absorption in the visible spectrum with a window of transmission in the 480-550 nm range that results in a green color. Due to the inclusion of the novel spacer segments, the DA π-conjugated polymer P3 harvests sunlight effectively and possess high charge carrier mobility.

Figure 3:
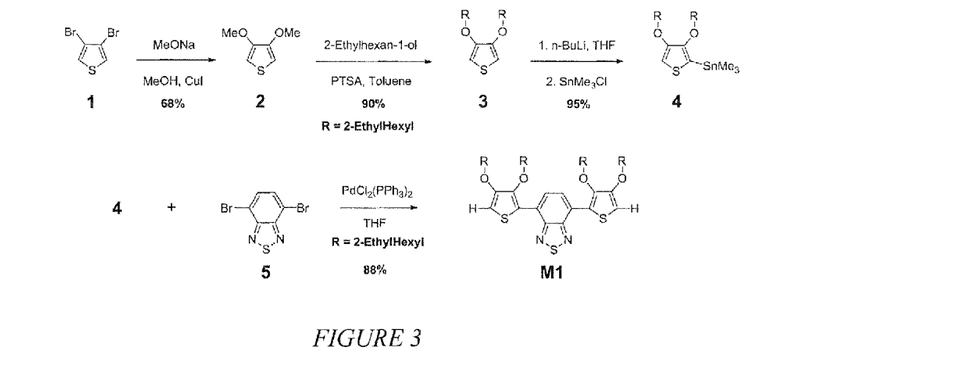
FIG. 3 is a reaction scheme for the preparation of the monomer, M1 for polymer P1, or portion of the monomer that constitutes the ultimate DA π-conjugated polymer's repeating unit that provides band gap tuning and processability to polymers P1, P2 and P3, according to an embodiment of the invention.
Figure 4:
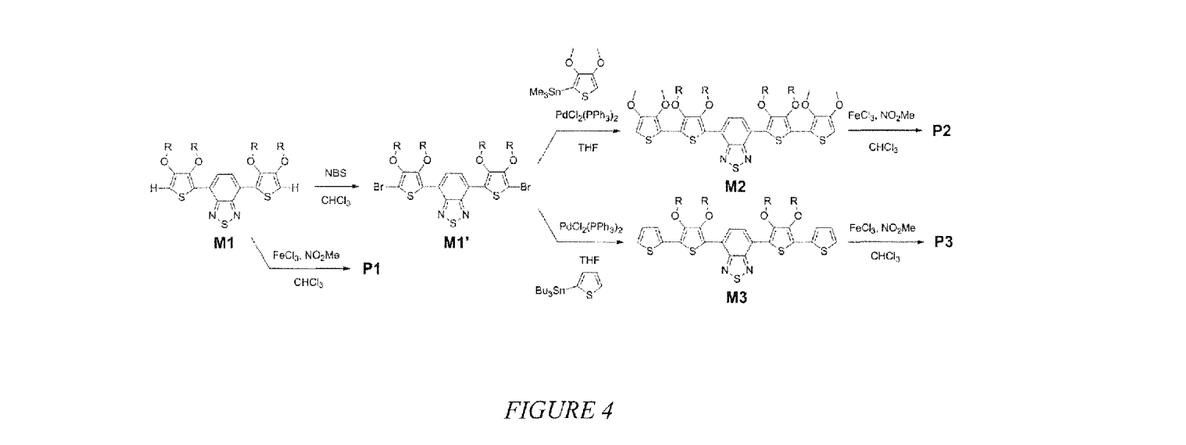
FIG. 4 are reaction schemes for the conversion of monomer M1 to monomers M2 and M3 and their polymerization to DA π-conjugated polymers P1, P2, and P3 according to embodiments of the invention.

FIG. 3 is a scheme for the preparation of a DAD sequence that can be further elaborated into monomers for the preparation of the novel DA π-conjugated polymers according to embodiments of the invention as illustrated in FIG. 4.

As shown in FIG. 3, a 3,4-substituted dioxythienyl intermediate 3 can be formed by use of one of a number of known chemical transformations. This donor precursor can be mono-functionalized, for example, by lithiation followed by its condensation with trimethyltinchloride to form the electron-rich intermediate 4. This mono-functionalized 3,4-substituted dioxythienyl trimethyl stannane 4 can be symmetrically coupled with a brominated electron-poor 2,1,3-benzothiadiazole, 5, in a palladium mediated cross-coupling reaction to yield M1. This donor-acceptor building block M1 exhibits four in-plane solubilizing side-chains that provide for solvent processability of an ultimate DA π-conjugated polymer. As shown in FIG. 4, the building block M1 can be polymerized using a mild oxidizing agent such as ferric chloride to afford a DA π-conjugated polymer P1, which is characterized as a control polymer without a spacer sequence to illustrate the advantageous properties imparted to DA π-conjugated polymers by the spacer segments according to embodiments of the invention. The building block M1 can be brominated into an intermediate M1' which can subsequently be symmetrically functionalized with various heterocycles possessing small solubilizing groups (the methoxy groups of the 3,4-dimetoxythiophenes) to yield M2 or unsubstituted thiophene to yield M3. These low oxidation potential oligomers M2 and M3 can be polymerized in the presence of a mild oxidizing agent such as ferric chloride to afford polymers P2 which lacks planar D2 units, and P3 that has the planar units according to an embodiment of the invention and is broadly absorbing. Table 1, below, gives the molecular weight, optical properties and thermal stability attained for exemplary polymers synthesized in the manner disclosed above.

Figure 5:
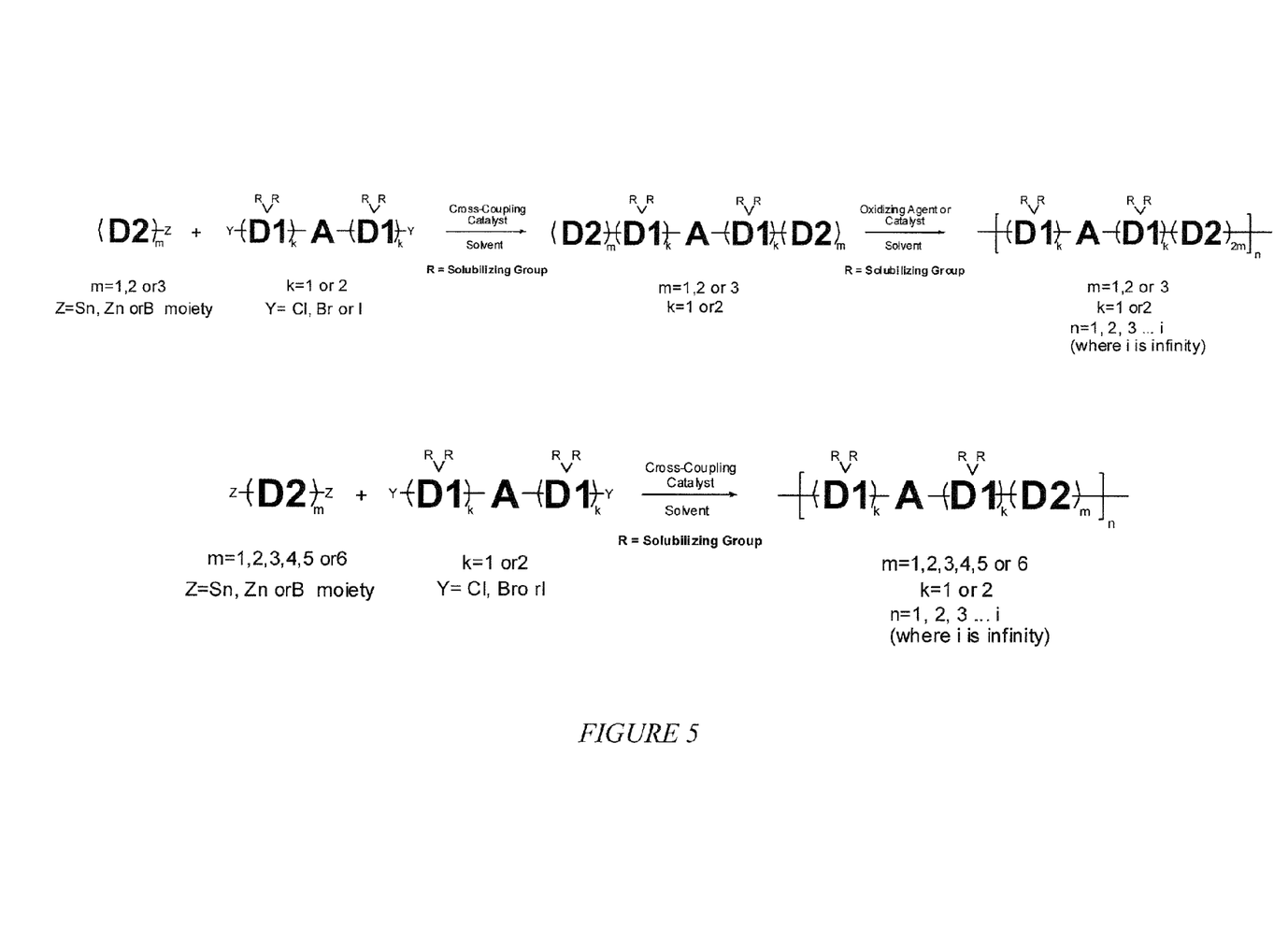
FIG. 5 shows alternate polymerization schemes for preparation of green soluble conjugated polymers with high charge carrier mobilities according to an embodiment of the invention.

FIG. 5 illustrates two schemes for preparing the DA π-conjugated polymers according to embodiments of the invention. The first scheme is equivalent to that shown for two specific polymers according to embodiments of the invention illustrated in FIG. 4. In FIG. 5 the spacer sequence of D2 donor units are planar units and ultimately reside between the first portion of the repeating unit (sequence) D1$_k$AD1$_k$ where k=1 or 2. The D2 units can be the same or different, such that the D2 units on either side of a given D1$_k$AD1$_k$ can be the same or different and any of the one or more D2 units in a sequence of D2 can be the same or different and can be assembled about the D1$_k$AD1$_k$ portion in a symmetric, asymmetric or random manner. Any given D2 units can be a single aromatic ring unit or fused aromatic ring units. Their function is to enhance the effective conjugation length of the polymer, by a greater co-planarity of aromatic units, and permits favorable approach, displacement and interaction between polymer chains. Heterocyclic units that can be employed as D2 include thiophene, pyrrole, furan, selenophene, telurophene, 3,4-dihydroxythiophene, 3,4-dihydroxypyrrole, 3,4-dihydroxyfuran, 3,4-dihydroxyselenophene, 3,4-dihydroxytelurophene, 3,4-diphenoxythiophene, 3,4-diphenoxypyrrole, 3,4-diphenoxyfuran, 3,4-diphenoxyselenophene, 3,4-diphenoxytelurophene, 3,4-diethenyloxythiophene, 3,4-diethenyloxypyrrole, 3,4-diethenyloxyfuran, 3,4-diethenyloxyselenophene, 3,4-diethenyloxytelurophene, 3,4-diformyloxythiophene, 3,4-diformyloxypyrrole, 3,4-diformyloxyfuran, 3,4-diformyloxyselenophene, 3,4-diformyloxytelurophene, 3,4-(1,2-vinylene)dioxythiophene, 3,4-(1,2-vinylene)dioxypyrrole, 3,4-(1,2-vinylene)dioxyfuran, 3,4-(1,2-vinylene)dioxyselenophene, 3,4-(1,2-vinylene)-dioxytelurophene, 3,4-(1,2-phenylene)dioxythiophene, 3,4-(1,2-phenylene)dioxypyrrole, 3,4-(1,2-phenylene)dioxyfuran, 3,4-(1,2-phenylene) dioxyselenophene, 3,4-(1,2-phenylene)-dioxytelurophene, 3,4-dicyanothiophene, 3,4-dicyanopyrrole, 3,4-dicyanofuran, 3,4-dicyanoselenophene, 3,4-dicyanotelurophene, 3,4-diaminothiophene, 3,4-diaminopyrrole, 3,4-diaminofuran, 3,4-diaminoselenophene, 3,4-diaminotelurophene, 3,4-dihalothiophene, 3,4-dihalopyrrole, 3,4-dihalofuran, 3,4-dihaloselenophene, 3,4-dihalotelurophene, thiophene-3,4-dicarboxylic acid, furan-3,4-dicarboxylic acid, selenophene-3,4-dicarboxylic acid, telurophene-3,4-dicarboxylic acid, 3,4-dihalothiophene, 3,4-dihalopyrrole, 3,4-dihalofuran, 3,4-dihaloselenophene, 3,4-dihalotelurophene, and other planar aromatic and heteroaromatic units.

The D1 units of the D1$_k$AD1$_k$ portion are electron rich donor D1 units that contain side chains that are of an appropriate size and structure to allow processing in solution or the melt. The D1 unit can be a 3,4-dioxythiophene, 3,4-dioxypyrrole, 3,4-dioxyfuran, 3,4-dioxyselenophene, or 3,4-dioxytelurophene, 3,4-alkylenedioxythiophene, 3,4-alkylene-

TABLE 1

GPC Estimated Molecular Weights of the Copolymers P1, P2, and P3 (from THF) and their Local Absorption Maxima (Solution and Solid State)

| Polymer | M$_n$ (g mol$^{-1}$) | PDI | Avg. No. of Repeat Units | Avg. No. of Rings | λ$_{abs}$ (nm) in Toluene | | λ$_{abs}$ (nm) of Thin Film | | T$_d$ (° C.)[b] |
|---|---|---|---|---|---|---|---|---|---|
| | | | | | 1 | 2 | 1 | 2 | |
| P1 | 16,300 | 2.6 | 20 | 60 | 391 | 638 | 399 | 653 (708)[a] | 321 |
| P2 | 43,000 | 2.1 | 39 | 195 | 430 | 613 | 446 | 651 | 322 |
| P3 | 69,300 | 1.6 | 71 | 355 | 422 | 591 | 448 | 636 | 321 |

[a]Shoulder.
[b]Onset decomposition temperature measured by TGA under nitrogen.

dioxypyrrole, 3,4-alkylenedioxyfuran, 3,4-alkylenedioxyselenophene, or 3,4-alkylenedioxytelurophene that is substituted with a side chain, at the 3 and/or 4 oxy substituent, on the alkylene bridge, or on the nitrogen of a pyrrole, with a group of sufficient size and structure to allow solubility of the ultimate DA π-conjugated polymer in one or more solvents. The side groups can be branched or straight chained C3 to C30 alkyl, or alkylene, or alkylaryl groups. The side groups can be interrupted or substituted with one or more functional groups to enhance solubility in a selected solvent, for example hydroxy, amino, ether, ester, carbonyl, carboxylic acid cyano, and halogen groups. The plurality of D1 units may be the same or different, and when different can be distributed in a symmetric, asymmetric or random manner about the A unit. When k=2 a pair of heterocyclic rings can be fused by a common substituent, for example a common substituent attached to the 3 position of both rings. The common substituent can be a carbon, oxygen, nitrogen, sulphur or silicon that bridges between the two rings. The fused rings can have the solubilizing side chain or chains attached to a bridging carbon, silicon or nitrogen or on any position of the rings.

The acceptor unit A can be any electron-deficient unit and can be a fused or a non-fused aromatic ring unit. For example the A unit can be a benzothiadiazole, thiadiazoloquinoxaline, quinoxaline, thienothiadiazole, thienopyrazine, pyrazinoquinoxaline, benzobisthiadiazole or thiadiazolothienpyrazine, either substituted or unsubstituted.

In the first scheme of FIG. 5 sequences of m=1 to 3 D2 units are attached to both ends of the $D1_kAD1_k$ sequence to form a $D2_mD1_kAD1_kD2_m$ sequence by a cross-condensation reaction. The $D2_m$ units can be monodispersed (all sequences of m's are equal) or polydispersed (where a variety of m sequences are present). This $D2_mD1_kAD1_kD2_m$ is the monomer for polymerization by a self-condensation reaction to the DA π-conjugated polymer, $(D2_mD1_kAD1_kD2_m)_n$. In the second scheme, sequences of m=1 to 6 D2 units, which can be the same or different and can be symmetric, asymmetric or random and either monodispersed or polydispersed, are polymerized with $D1_kAD1_k$ sequences where $D2_m$ is a complementary monomer to $D1_kAD1_k$ for cross-condensation into a desired DA π-conjugated polymer $(D1_kAD1_kD2_m)_n$.

The specific embodiments, above, contain alkoxy groups to enhance solubility and processability in organic solvents, such as chloroform, tetrahydrofuran, toluene, chlorobenzene, and dichlorobenzene. In other embodiments of the invention more polar or ionic side chains can be attached to the donor molecules of the DAD sequence to induce solubility in a broader range, and in some cases, more polar solvents. These alternate side chains include oligoether, ester, amide, carboxylic acid, sulfonate, amine and other polar functionalities. One advantage of polar and ionic side chains is for specific interaction with a substrate upon which the DA π-conjugated polymer is deposited during the formation of a device. For example, the polar or ionic side chain can promote adsorption of the DA π-conjugated polymer onto an oxide surface to prepare titania based solar cells (Graetzel Cells). In one embodiment of the invention the side chain can be an ester that can be converted to an alcohol, carboxylic acid or carboxylic acid derivative in a manner taught in Reynolds et al. International Patent Application Publication No. WO2007/087587, Aug. 2, 2007, entitled "Chemical Defunctionalization of Polymeric Alkylenedioxyheterocyclics" and is incorporated herein by reference.

Figure 6:
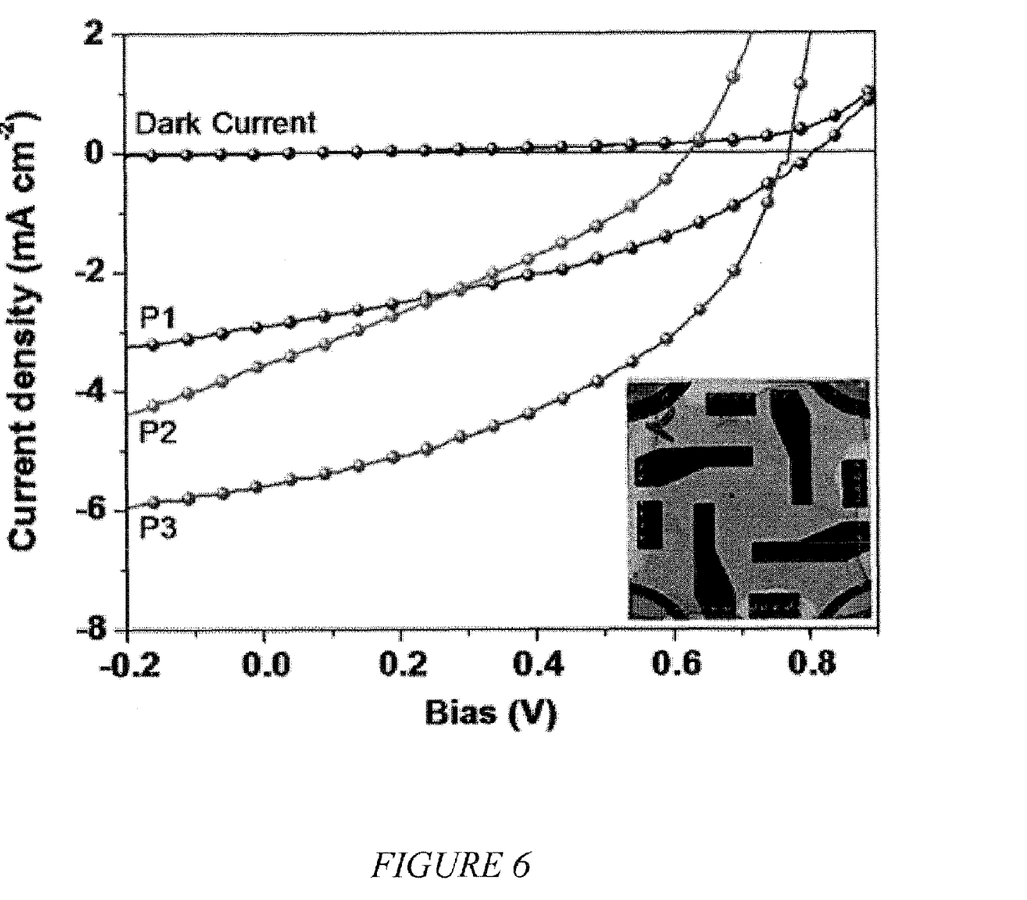
FIG. 6 shows I-V curves for based BHJ solar cells according to an embodiment of the invention with device structures: ITO/PEDOT/PX:$PC_{60}BM$/LiF/Al with PX=P1, P2 or P3 employing optimal polymer:PCBM composition where the curve for the dark curent is that of the P1 device and where the other curves are for AM 1.5 solar illumination, 100 mW $cm^{-2}$ (blue, green and red). The photograph insert is for P3 at a polymer:PCBM ratio of 1:8 when backlit such that Al contacts appear black.

The enhanced charge carrier properties of the DA π-conjugated polymers are illustrated in FIG. 6, where P3, a DA π-conjugated polymer according to an embodiment of the invention, has a spacer sequence of two unsubstituted thiophene units and allows construction of photovoltaic solar cell exhibiting a current density that is about double over a wide range of applied bias to a cell constructed with the control P1 without a spacer, or even P2, that has a relatively small substituent on a structure that does not permit all of its atoms to reside in the plane defined by the thiophene ring. The cell has the structure ITO/PEDOT/PX:$PC_{60}$BM/LiF/Al where ITO is a transparent indium-tin-oxide electrode with an internal layer of poly(3,4-ethylenedioxythiophene) against a DA π-conjugated polymer, PX, containing a substituted buckminsterfullerene, $PC_{60}$BM, ([6,6]-phenyl-C61-butyric acid methyl ester) with LiF on an aluminum electrode. Not only did the cell with P3 display the highest photovoltaic performance, as illustrated in FIG. 6, but P3 also possesses the highest thermal stability, up to 320° C. under a nitrogen atmosphere, which is a feature that is consistent with a structure with good π-stacking of the DA polymers. The DA polymers can be easily deposited by various methods, such as spin-coating, spray-casting, ink-jet printing or stamping, in the formation of a photovoltaic device.

In one embodiment of the invention, the DA π-conjugated polymers with high charge mobilities are blended with PCBMs, such as $PC_{60}$BM or $PC_{70}$BM, or other similarly functionalized bucminsterfullerenes to further enhance the photovoltaic performance over that of the unblended DA π-conjugated polymers. In these blends the DA polymers function as the electron donor and the PCBMs function as the electron acceptor. Surprisingly, the hole current in the blends is found to be significantly higher for optimized compositions than is observed with unblended DA π-conjugated polymers. The hole mobility in the DA polymer phase of the blend is enhanced by about an order of magnitude or more as given in Table 2, below, relative to the DA polymers. This enhanced hole migration occurs even though the DA polymer phase is significantly diluted in the blends, which can lead to reduced charge transport properties because of incomplete percolation. The PCBMs can be included at up to 95 percent by weight of the blend. Other acceptors can be blended with the DA π-conjugated polymers, including inorganic metal oxides, for example zinc oxide.

TABLE 2

Zero-field hole mobility of polymers and their optimized blends, where mobilities are derived from fitting the J-V data to trap-free single-carrier SCLC model.

| DA π-Conjugated Polymer | Zero-Field Hole Mobility in $cm^2 V^{-1}s^{-1}$ |
|---|---|
| P1 | $5.4 \times 10^{-8}$ |
| P2 | $6.9 \times 10^{-7}$ |
| P3 | $3.9 \times 10^{-6}$ |
| P1:$PC_{60}$BM | $2 \times 10^{-6}$ |
| P2:$PC_{60}$BM | $5 \times 10^{-6}$ |
| P3:$PC_{60}$BM | $1 \times 10^{-5}$ |

Solution processable neutral state green conjugated polymers with enhanced charge transport properties permit the formation of photovoltaic devices, such as the device shown in the photographic insert of FIG. 6. Such devices can be aesthetically-pleasing and can be used, for example, as power-generating displays, light-harvesting windows, or camouflage power-generating devices for military and other uses. Solution processable conjugated polymers are potentially of significantly lower cost, are readily scalable, lighter in mass and can display advantageous mechanical properties, such as flexibility and durability, as opposed to that of traditional inorganic counterparts such as, for example, polycrystalline silicon.

In addition to flexible photovoltaic device applications, the highly efficient materials DA π-conjugated polymers according to embodiments of the invention have utility as an alternative to polycrystalline silicon solar cells providing a lower costs alternative. The ability to absorb sunlight from the UV (ca. 400 nm) through a majority of the visible light region and into the NIR (ca. 800-900 nm) is desirable to optimize a solar cell's efficiency. These novel DA π-conjugated polymers can simultaneously function as the light absorber and as an electron donor to an acceptor, such as a buckminsterfullerene derivative (PCBM) in a solar cell application. Advantageously, the ability to tune the absolute values of the HOMO and LUMO levels of a specific DA π-conjugated polymer allows the design of a structure with a desired photo-excited state to promote electron transfer to a specific acceptor. After the electron transfer, the hole and electron carriers generated are efficiently collected because the spacer sequences of the DA π-conjugated polymers allows a high degree of planarity and strong inter-chain interactions between the backbones of the polymers, which results in high charge mobilities.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

We claim:

1. A donor-acceptor (DA) π-conjugated polymer with high charge carrier mobility comprising:

a plurality of $D1_k A D1_k$ portions where k is 1 or 2, D1 independently comprises a donor unit having at least one solubilizing side chain, wherein said D1 comprises 3,4-dioxythiophene, 3,4-dioxypyrrole, 3,4-dioxyfuran, 3,4-dioxyselenophene, or 3,4-dioxytelurophene, 3,4-alkylenedioxythiophene, 3,4-alkylenedioxypyrrole, 3,4-alkylenedioxyfuran, 3,4-alkylenedioxyselenophene, or 3,4-alkylenedioxytelurophene, wherein said solubilizing side chain is attached to an oxy group or any carbon of said D1, and A comprises an acceptor unit; and a plurality of $D2_m$ spacer sequences situated between each of said $D1_k A D1_k$ portions, where m is 1 to 6, D2 independently comprises a second donor unit, wherein said second donor unit has a structure where all atoms of said second donor unit are coplanar in at least one conformation, wherein said D2 comprises an aromatic or heteroaromatic unit, wherein said heteroaromatic unit comprises thiophene, pyrrole, furan, selenophene, telurophene, 3,4-dihyrdroxythiophene, 3,4-dihydroxypyrrole, 3,4-dihydroxyfuran, 3,4-dihydroxyselenophene, 3,4-dihydroxytelurophene, 3,4-diphenoxythiophene, 3,4-diphenoxypyrrole, 3,4-diphenoxyfuran, 3,4-diphenoxyselenophene, 3,4-diphenoxytelurophene, 3,4-diethenyloxythiophene, 3,4-diethenyloxypyrrole, 3,4-diethenyloxyfuran, 3,4-diethenyloxyselenophene, 3,4-diethenyloxytelurophene, 3,4-diformyloxythiophene, 3,4-diformyloxypyrrole, 3,4-diformyloxyfuran, 3,4-diformyloxyselenophene, 3,4-diformyloxytelurophene, 3,4-(1,2-vinylene)dioxythiophene, 3,4-(1,2-vinylene)dioxypyrrole, 3,4-(1,2-vinylene)dioxyfuran, 3,4-(1,2-vinylene)dioxyselenophene, 3,4-(1,2-vinylene)dioxytelurophene, 3,4-(1,2-phenylene)dioxythiophene, 3,4-(1,2-phenylene)dioxypyrrole, 3,4-(1,2-phenylene)dioxyfuran, 3,4-(1,2-phenylene)dioxyselenophene, 3,4-(1,2-phenylene)dioxytelurophene, 3,4-dicyanothiophene, 3,4-dicyanopyrrole, 3,4-dicyanofuran, 3,4-dicyanoselenophene, 3,4-dicyanotelurophene, 3,4-diaminothiophene, 3,4-diaminopyrrole, 3,4-diaminofuran, 3,4-diaminoselenophene, 3,4-diaminotelurophene, 3,4-dihalothiophene, 3,4-dihalopyrrole, 3,4-dihalofuran, 3,4-dihaloselephene, 3,4-dihalotelurophene, thiophene-3,4-dicarboxylic acid, furan-3,4-dicarboxylic acid, selenophene-3,4-dicarboxylic acid, telurophene-3,4-dicarboxylic acid, 3,4-dihalothiophene, 3,4-dihalopyrrole, 3,4-dihalofuran, 3,4-dihaloselenophene, or 3,4-dihalotelurophene, and wherein said DA π-conjugated polymer has a space-charge limited (SCL) zero field hole mobility of at least $1 \times 10^{-6}$ cm$^2$V$^{-1}$s$^{-1}$.

2. The DA π-conjugated polymer of claim 1, wherein said DA π-conjugated polymer reflects a blue tinted green, deep green, or yellow tinted green color.

3. The DA π-conjugated polymer of claim 1, wherein said $D1_k$ comprises $D1_2$ with a pair of heterocyclic rings fused with a common substituent comprising a carbon, oxygen, nitrogen, sulphur or silicon bridge between said rings, wherein said solubilizing side chain is attached to any carbon, oxygen, nitrogen, sulphur or silicon of said $D1_2$.

4. The DA π-conjugated polymer of claim 3, wherein said $D1_k$ comprises $D1_2$ as a fused cyclopentadithiophene or a fused dithienosilole fused derivative, wherein said solubilizing side chain is attached to any carbon, oxygen, nitrogen, sulphur or silicon of said $D1_2$.

5. The DA π-conjugated polymer of claim 1, wherein said side chain comprises branched or straight chained C3 to C30 alkyl, or alkylene, or alkylaryl where said side chain is uninterrupted, unsubstituted, interrupted or substituted with one or more functional groups, where said functional group comprises hydroxy, amino, ether, ester, carbonyl, carboxylic acid cyano, or halo.

6. The DA π-conjugated polymer of claim 1, wherein said A comprises a nitrogen-containing electron-accepting heterocycle.

7. The DA π-conjugated polymer of claim 6, wherein said nitrogen-containing electron-accepting heterocycle comprises benzothiadiazole, thiadiazoloquinoxaline, quinoxaline, thienothiadiazole, thienopyrazine, pyrazinoquinoxaline, benzobisthiadiazole or thiadiazolothienpyrazine, and wherein said nitrogen-containing electron-accepting heterocycle is substituted or unsubstituted.

8. The DA π-conjugated polymer of claim 1, wherein said A comprises benzothiadiazole, D1 comprises dioxythiophenes having C3 to C30 alkyl groups and D2 comprises thiophene.

9. The DA π-conjugated polymer of claim 1, further comprising a PCBM as a blend.

10. The DA π-conjugated polymer of claim 9, wherein said PCBM is [6,6]-phenyl-C61-butyric acid methyl ester (PC$_{60}$BM), [6,6]-phenyl-C71-butyric acid methyl ester (PC$_{70}$BM), or a functionally equivalent substituted buckminsterfullerene.

11. The DA π-conjugated polymer of claim 9, wherein said PCBM is up to 95 percent by weight of said blend.

12. The DA π-conjugated polymer of claim 1, further comprising an inorganic metal oxide as a blend.

* * * * *

UNITED STATES PATENT AND TRADEMARK OFFICE
CERTIFICATE OF CORRECTION

| | | |
|---|---|---|
| PATENT NO. | : 8,372,315 B2 | Page 1 of 1 |
| APPLICATION NO. | : 13/321880 | |
| DATED | : February 12, 2013 | |
| INVENTOR(S) | : Pierre M. Beaujuge, John R. Reynolds and Stefan M. Ellinger | |

It is certified that error appears in the above-identified patent and that said Letters Patent is hereby corrected as shown below:

On the Title Page
Item (57), Abstract,
Lines 6-7, "the $D1_kAD1_k$ portions" should read --the $D1_xAD1_x$ portions--.

In the Specification
Column 1,
Line 19, "Contract No. UF. Project 59866" should read --Contract No. FA9550-06-1-0192--.
Line 50, "Having a et al" should read --Havinga et al--.

Signed and Sealed this
Eleventh Day of February, 2014

Michelle K. Lee
*Deputy Director of the United States Patent and Trademark Office*